United States Patent [19]

Tanaka

[11] Patent Number: 4,461,800
[45] Date of Patent: Jul. 24, 1984

[54] PRESS PAD FOR FORMING PRESS

[75] Inventor: Atsuo Tanaka, Yawata, Japan

[73] Assignee: Yamauchi Rubber Industry Co., Ltd., Osaka, Japan

[21] Appl. No.: 442,137

[22] Filed: Nov. 16, 1982

[30] Foreign Application Priority Data

Nov. 27, 1981 [JP] Japan .................. 56-177122[U]

[51] Int. Cl.³ .................. B29D 17/00; B29C 3/00; B32B 5/32
[52] U.S. Cl. .................. 428/217; 100/295; 156/323; 428/230; 428/246; 428/284; 428/316.6; 428/319.1; 425/394
[58] Field of Search .................. 38/66, 140; 428/227, 428/233, 234, 235, 217, 230, 231, 246, 248, 249, 282, 284, 285, 316.6, 319.1; 100/295, 296, 297; 156/323, 583.1; 425/394, 411

[56] References Cited

U.S. PATENT DOCUMENTS

| | | | |
|---|---|---|---|
| 2,741,045 | 4/1956 | Merkin | 38/140 |
| 2,999,041 | 9/1961 | Lappala | 428/316.6 |
| 3,096,545 | 7/1963 | Rowland | 100/297 |
| 3,323,238 | 6/1967 | Cohen | 38/66 |
| 3,471,955 | 10/1969 | Cohen | 38/66 |
| 3,535,198 | 10/1970 | Bloom | 428/319.1 |
| 3,684,613 | 8/1972 | Frohning | 100/296 |
| 3,847,724 | 11/1974 | Powers et al. | 428/319.1 |
| 4,043,062 | 8/1977 | Lehrman | 38/140 |
| 4,238,179 | 12/1980 | Llabrès et al. | 425/394 |
| 4,340,439 | 7/1982 | Giesler | 156/323 |
| 4,360,984 | 11/1982 | Ruthenberg | 38/140 |

Primary Examiner—William J. Van Balen
Attorney, Agent, or Firm—Hubbell, Cohen, Stiefel & Gross

[57] ABSTRACT

A press pad comprising a laminated core, made by sandwiching a hard cushion layer formed either by impregnating a porous elastic sheet with a binder and subsequently setting it or by sandwiching one or more rigid sheets of a high thermal conductivity between a plurality of porous elastic sheets individually impregnated with said binder and subsequently treated for setting thereof between two rigid sheets of a high thermal conductivity and soft cushion layers of porous elastic sheet bonded to both surfaces of said laminated core to be united with the latter as a body; which is useful for the manufacture of printed circuit boards, laminated sheets and so forth and which shows improved durability or heat-up property.

13 Claims, 3 Drawing Figures

PRESS PAD FOR FORMING PRESS

BACKGROUND OF THE INVENTION

1. Field of the Invention

The present invention relates to a press pad for forming press, more particularly to a press pad for a high temperature/high pressure forming press used for the manufacture of printed circuit boards, laminated sheets, facing sheets, facing veneers, synthetic resin laminates and the like.

2. Description of the Prior Art

For the manufacture of phenolic resin or epoxy resin laminated sheets it has been the usual practice to laminate the required number of the so-called prepregs in B-stage prepared by impregnating base webs such as of paper or glass cloth with a resin and pre-setting the same, put the resulting laminate, faced if necessary with a decorative paper, steel foil or the like, between a pair of mirror plates, set this between the platens of a press with press pads thereon, and heat the laminate at 150~190° C. under a pressure of 40~150 kg/cm² so as to refluidize and subsequently set the resin.

As press pads intended for such purposes have been commonly used those made of such simple materials as non-woven fabric, paper, woven fabric and glass wool or composite materials thereof are disclosed in Japanese Utility Model Publication Nos. Sho-47-13492, Sho-54-25420 and Japanese patent publication No. Sho-53-9269.

Such press pads are, however, known to be liable to relatively early remarkable and/or irregular decrease in thickness due to loss of elastic resilience or strain recovery as they are used repeatedly under high temperature and high pressure conditions. Such a decrease in thickness is bound to result in not only early deterioration of the pad's cushioning property but also variation of its rate of heat transfer, uneven distribution of heat therein and further uneven distribution of pressure applied therethrough to possibly give cause for such defects as thin spots and voids to eventually make the pad unusable. Thus, press pads of prior art had an essential shortcoming of being relatively short in usable life.

In order to eliminate such shortcoming of the quoted prior art, there have been made such proposals as to impregnate a press pad or cushion layer consisting of a fibrous material with a synthetic resin or rubber and subsequently setting the same for fixing the interlacing points of fibers so as to improve its elastic resilience as disclosed in Japanese Utility Model Publication No. Sho-52-3415, Japanese Utility Model Public Disclosure No. Sho-55-154136 etc., or to put a rigid sheet between layers of needle-punched nonwoven web with a release layer formed on the outer surface thereof and adhesive-bonding them together to provide a press pad for forming press as disclosed in Japanese Utility Model Publication No. Sho-54-1507.

With the former, however, there is noted a drawback of the good cushioning property of the pad's surface essential in particular for a cushion material as such being adversely affected and, moreover, the desired quality of fitting closely with the mirror plates being deteriorated thereby, while, with the latter, there is a problem about the durability of the proposed, allegedly improved press pad as when it is subjected repeatedly to a high pressure, the unaided rigid sheet is inevitably deformed in the direction of the pad's thickness if gradually to eventually be so-to-speak buckled, although deformation in the said direction of the pad as a whole is somewhat prevented indeed for the horizontal elongation of the nonwoven web layers is restricted by the said rigid sheet.

SUMMARY OF THE INVENTION

The present invention has been made after extensive and intensive research efforts for elimination of the aforesaid shortcomings of the prior art, its object being providing a press pad or cushion material for forming press safe from any marked and/or uneven decrease in thickness either overall or locally for a relatively long period of time, hence improved in durability and, as regards thermal conductivity, improved in heat-up property and superior in its ability to uniformalize the temperature distribution in the material being pressed.

For accomplishing the abovementioned object, the press pad of the present invention is made up of a laminated core comprising hard cushion layers made by impregnating porous elastic sheets such as of sponge or nonwoven web with a binder based on a resin, rubber or the like and subsequently setting the same and rigid sheets such as of a metal of a high thermal conductivity laminated together and soft cushion layers consisting of porous elastic sheets laminated on at least one side of the said laminated core to be integral therewith.

DETAILED DESCRIPTION OF THE PREFERRED EMBODIMENTS

Figure 1:
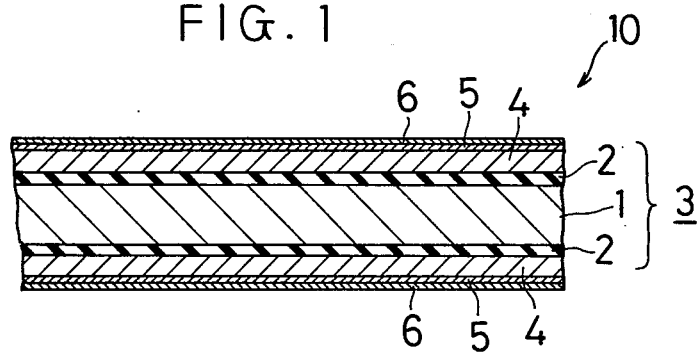
FIG. 1 is a cross-sectional view of an embodiment of a press pad for forming press of the present invention.

The hard cushion layer consists of porous elastic sheets of nonwoven web composed of a fiber of good heat resistance, rubber or synthetic resin foam (sponge), cloth or paper either alone or in combination impregnated with a binder based on a resin, rubber or the like and finished with subsequent setting of the binder to voids of 5~50 volume %.

Of the above various materials, most preferred as porous elastic sheet for the purpose is needle-punched nonwoven web for the required cushioning properties, ease of impregnation with binder etc. As such nonwoven webs known are those made of natural fibers such as cotton or linen, synthetic fibers such as polyester or nylon, inorganic fibers such as asbestos or glass fiber, or metallic fiber alone or in combination. Preferred are, however, those made of synthetic fibers such as nylon or polyester for the desired heat resistance and cushioning properties etc. The acceptable range of their specific weight is 150~2,000 g/m², preferably 450~1,500 g/m², and the range of needle-punching rate 50~400 needles/cm², preferably 200~300 needles/cm².

As binders used for impregnating the abovementioned porous elastic sheet for subsequent setting therein are known those based on such synthetic resin as polyurethane, polyester or polyimide. As rubber-based binders, on the other hand, especially preferred are those based on acrylic rubber or fluororubber latex, while those based on styrenebutadiene rubber, nitrile rubber, chloroprene rubber or ethylene-propylene terpolymer are also usable.

As method of impregnation with such a binder can be employed dipping process, dot coater process etc. The impregnation pickup is 3~150 (wt. %) with the weight of porous elastic sheet as 100, this being equivalent to 3~60 wt. % of the total weight of the hard cushion layer less that of the rigid sheet. When the impregnation pickup is less than 3 wt. %, the effect to fix the interlacing points in nonwoven web is insufficient and no good resistance to pressure or elastic resilience can be hoped for, while when it is in excess of 60 wt. %, the voids (%) of the porous elastic sheet is decreased to such an extent that the desired elasticity thereof is affected rather badly. The preferred range of impregnation pickup is 20~40 wt. %.

The thickness of the hard cushion layer ranges approximately from 0.5 mm to 4.0 mm.

The rigid sheet laminated with the abovementioned hard cushion layer is required to be nonelastic and particularly high in thermal conductivity. Hence the most preferred material thereof is iron, aluminum, alloy thereof or the like but heat resistant synthetic resin sheets incorporating metallic fibers or having metal powders dispersed therein such as of polyimide, polyparabanic acid resin, polysulfone resin or the like may as well be used as well as perforated sheets thereof. The thickness of the rigid sheet is 0.05~2.0 mm, preferably 0.3~0.5 mm.

The abovementioned hard cushion layer and two rigid sheets are to be laminated and bonded together to form a rigid laminated core. When the hard cushion layer is thick with its specific weight more than 1,500 g/m$^2$, it may as well be formed as a composite sheet consisting of two binder impregnated porous elastic sheets with a rigid sheet sandwiched in between. For bonding thereof a heat resistant adhesive based on epoxy resin or the like may be used as well as an adhesive sheet made by impregnating or coating a base sheet of paper, fabric, nonwoven fabric or the like with an adhesive. Of course, however, the above are mere examples, not limiting the mode of combination of hard cushion layer and rigid sheet thereto.

The soft cushion layer bonded to the outside of the said laminated core to be an integral part of the press pad is what imparts good cushioning properties to the surface layer of the pad or cushioning material and consists of one or more than one in combination of the abovementioned various alternative materials for the porous elastic sheet used as the base of the hard cushion layer, namely nonwoven web, elastic foam of a synthetic resin or rubber, fabric, paper and the like, especially preferred being a needle-punched nonwoven web consisting of a synthetic fiber such as of nylon or polyester. The said nonwoven web may be of an area weight of 50~1,500 g/m$^2$ and needle-punching rate of 50~400 needles/cm$^2$. If the area weight is too small, the desired cushioning properties can hardly be obtained, whereas, if it is too large, there is a risk of permanent deformation becoming too marked to result in a harmful decrease in thickness and possibly in the so-called buckling. Hence a preferred range of area weight thereof is 300~600 g/m$^2$. As regards the needle-punching rate, on the other hand, the recovery potential of the cushion layer is insufficient when it is less than 50 needles/cm$^2$, while increased snappage of fibers results to cause marked drop of the mechanical strength of the nonwoven web per se when it is in excess of 400 needles/cm$^2$. Hence it may preferably in a range of 200~300 needles/cm$^2$.

Needless to say, a release layer is to be formed over the surface of the soft cushion layer. This release layer is generally formed of a resin of improved releasing property and resistance to heat, and preferred as such is a synthetic resin e.g. silicone resin or fluoroplastic. This release layer may be formed by adhesive-bonding a resin film to the surface of the soft cushion layer or by coating it with a resin compound, but when the soft cushion layer is composed of nonwoven web of a thermoplastic fiber, it is advantageous to melt the said nonwoven fabric superficially to form a thin porous surface layer or film before applying a synthetic resin coating to form a release layer thereon. Then, the resin of the release layer formed is partly allowed to penetrate in the course of coating through the abovementioned surface layer or film into the nonwoven web to be subsequently set therein for the release layer to be firmly anchored to the nonwoven web mechanically, hence peeling, cracking etc. thereof can be effectively prevented and its durability can further be improved.

The press pad or cushioning material of the present invention with its composition as described above has the following outstanding features suited for accomplishment of the first-mentioned object of the invention.

Firstly, owing to the presence of the laminated core made up of the hard cushion layers and rigid sheets firmly bonded together the press pad of the invention has the horizontal elongation of its hard cushion layer and soft cushion layer in close contact with the rigid sheet restricted effectively even when it as a whole is repeatedly subjected to a high pressure, while the hard cushion layer has an excellent restoring force (recovery potential) in addition to its properly controlled elasticity to be not easily deformed in the direction of thickness, hence the press pad as a whole is safe from any marked decrease of its thickness with the lapse of time, there is no risk of the so-called buckling and further improved is its durability.

Furthermore, the rigid sheet of high thermal conductivity is used as an integral component of the said laminated core, this accounting for uniform distribution therein of the heat transmitted from the platen, and the risk of any local temperature unevenness in the press pad can be effectively prevented thereby. Also, the presence of the hard cushion layer subject to less variation in thickness enables controlling the rate of heat transfer across the press pad to be always roughly constant, hence the press pad of the invention is excellent in heat-up property so as to exhibit always constant, favorable thermal influences on the laminated sheet to be formed and uniform finish of the formed products can thus be ensured.

Also, since on the outer side of the laminated core is formed the soft cushion layer of excellent elastic deformability, the press pad of the invention is improved in fitting with the platen, mirror plate etc. with which it comes into contact and is capable of compensating possible surface irregularities and/or deformation thereof to ensure generally uniform transmission of the applied pressure, at the same time helping prevent damage to the surface of the mirror plate, and the surface of the pad itself is safe or safer from damage. Moreover, since the cushioning properties of the press pad as a whole are improved by this hard cushion layer, the thickness of the soft cushion layer can be reduced to a very minimum which is absolutely necessary, and even if its thickness should be somewhat decreased, its influence on the overall thickness of the press pad is insignificantly small and there is no risk of it affecting the pad's durability.

Further, since it is possible to impart to the press pad itself an excellent tenacity against bending by making the laminated core relatively rigid and solid, the press pad of the invention is applicable without any problem also to an automatic press of the type in which the press pads are set and taken out mechanically.

Referring now to the accompanying drawings, the practice of the present invention is illustrated in the following examples.

EXAMPLE 1

The press pad 10 in this embodiment is of the composition shown in FIG. 1 in which a hard cushion layer 1 has bonded to both sides thereof by the use of an epoxy resin-based adhesive two rigid sheets 2 to comprise a united body of laminated core 3, which, in turn, has bonded to both sides thereof again by the use of the epoxy resin-based adhesive two soft cushion layers 4 having a release layer 6 formed on the surface to comprise a laminated pad.

The hard cushion layer 1 is made by impregnating with fluororubber latex [Dai-el Latex GLS 321, Daikin Industries Ltd., Japan] a nonwoven web of 6—6 nylon fiber [6342R, trade name of Kureha Sen'i K.K., Japan] with an area weight of 1,050 g/m$^2$ and a needle-punching rate of 200 needles/cm$^2$ with a pickup of 30 wt. % (in terms of solid content) and setting the binder (latex) therein. The rigid sheet 2 is a 0.25 mm thick SPCC-SD [cold rolled steel sheet, Nippon Kokan K.K.] cut to the size.

The soft cushion layer 4 consists of a polyester nonwoven web [Kurelock EH-2, Kureha Sen'i K.K., Japan] with an area weight of 550 g/m$^2$ and a needle-punching rate of 200 needles/cm$^2$ with its surface premelted to form a thin melted film 5 and then coated over it with a fluoroplastic compound [Dai-el GL-152, Daikin Industries Ltd., Japan] to form a release layer 6.

This press pad 10 is made by laminating together one hard cushion layer 1 preimpregnated with a binder which is then set to B-stage, two rigid sheets 2 coated on both sides with an adhesive [YE-1416, Ryoden Kasei K.K., Japan] and two soft cushion layers 4 with each one release layer 6 preformed over their surfaces, and pressforming the laminate for 50 minutes under the conditions of 15 kg/cm$^2$ and 160° C.

EXAMPLE 2

Figure 2:
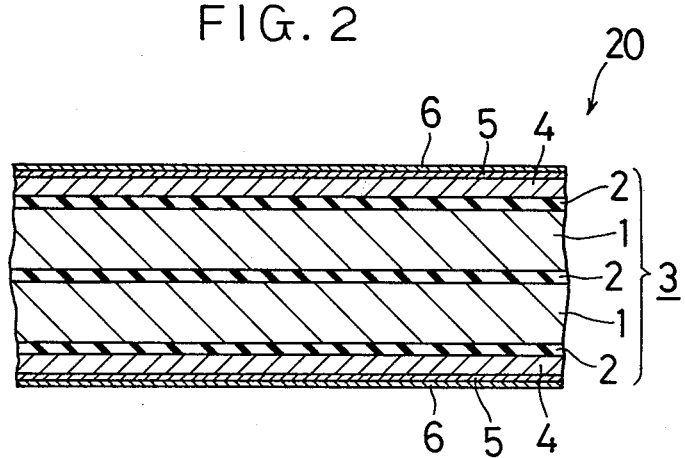
FIG. 2 is a cross-sectional view of another embodiment of a press pad for forming press of the present invention.

In the press pad 20 in this embodiment shown in FIG. 2 there are provided a hard cushion layer comprising two binder impregnated porous elastic sheets 1 with a rigid sheet 2 sandwiched in between and the binder pickup of the hard cushion layers is increased to 200 wt. %, its composition being otherwise identical with that described in the example 1. Hence in this example like parts are referred to by like numerals.

When the press pads described above in examples 1 and 2 were actually used under the conditions for the manufacture of epoxy resin laminated sheets, namely a temperature of 180° C. and a pressure of 40 kg/cm$^2$, they were still usable even after 200 times of repeated use with no indication of harmful buckling and with no risk of causing any defect to the product. In contrast thereto, when conventional counterparts made by simply laminating needle-punched nonwoven nylon webs and subsequently bonding them together were used under like conditions as mentioned above, they were not usable after 80 times of repeated use with indication of harmful buckling and of causing low spots of the product.

EXAMPLE 3

Figure 3:
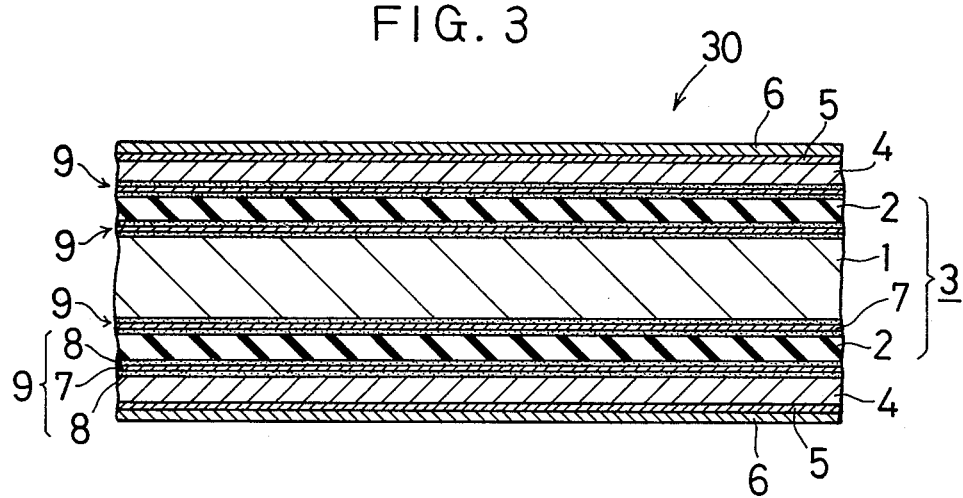
FIG. 3 is a cross-sectional view of still another embodiment of a press pad for forming press of the present invention.

The press pad 30 in this embodiment shown in FIG. 3 has its laminated core 3 made by bonding a hard cushion layer 1 and a rigid sheet 2 across a prepreg 9 of paper made of polyester fiber 7 coated with a modified epoxy resin-based adhesive 8 [YE-1416, Ryoden Kasei K.K., Japan] into a united layer is otherwise composed identical with that of the example 1. Hence in this example like parts are referred to by like numerals.

Although a certain preferred embodiment has been shown and described, it should be understood that many changes and modifications may be made therein without departing from the scope of the appended claims.

What is claimed is:

1. A press pad for a forming press comprising a laminated core, said laminated core comprising at least one hard cushion layer disposed between two rigid sheets, said rigid sheets having a high thermal conductivity; and two soft cushion layers, said soft cushion layers comprising porous elastic sheets, said soft cushion layers being bonded to each of the surfaces of said laminated core, said hard cushion layer comprising at least one porous elastic sheet impregnated with a binder.

2. A press pad as recited in claim 1, wherein said laminated core comprises a composite sheet disposed between two rigid sheets; said composite sheet comprising a rigid sheet disposed between two hard cushion layers.

3. A press pad as recited in claim 1 or 2, wherein said porous elastic sheets comprise a nonwoven web, foam of rubber or a synthetic resin, cloth or paper.

4. A press pad as recited in claim 1 or 2, wherein said porous elastic sheet comprises a nonwoven web of a synthetic fiber of the group comprising nylon and polyester.

5. A press pad as recited in claim 4, wherein the nonwoven web is a neddle punched web having a specific weight of 150~2,000 g/cm$^2$ and wherein the rate of needle-punching is 50~400 needles/cm$^2$.

6. A press pad as recited in claim 1 or 2, wherein said binder is based on a synthetic resin selected from the group consisting of polyurethane, polyester, acrylic resin and polyimide.

7. A press pad as recited in claim 1 or 2, wherein said binder is based on a rubber selected from the group consisting of acrylic rubber and fluororubber.

8. A press pad as recited in claim 1 or 2, wherein the impregnation pickup of said binder is 3~150 (wt. %) with the weight of said porous elastic sheet as 100.

9. A press pad as recited in claim 1 or 2, wherein said rigid sheet comprises a metal selected from the group consisting of iron, aluminum and an alloy thereof.

10. A press pad as recited in claim 1, wherein the thickness of said rigid sheet is 0.05~2.0 mm.

11. A press pad as recited in claim 1, wherein each of said soft cushion layers has formed on its surface a release layer.

12. A press pad as recited in claim 1, wherein the impregnation pickup of said binder is 25~67 (wt. %).

13. A press pad as recited in claim 1, wherein the thickness of said rigid sheet is 0.3~0.5 mm.

* * * * *